United States Patent
Lee et al.

(10) Patent No.: US 9,263,342 B2
(45) Date of Patent: Feb. 16, 2016

(54) SEMICONDUCTOR DEVICE HAVING A STRAINED REGION

(75) Inventors: Tsung-Lin Lee, Hsinchu (TW); Feng Yuan, Yonghe (TW); Hung-Li Chiang, Taipei (TW); Chih Chieh Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/411,214

(22) Filed: Mar. 2, 2012

(65) Prior Publication Data
US 2013/0228862 A1    Sep. 5, 2013

(51) Int. Cl.
*H01L 21/20* (2006.01)
*H01L 21/336* (2006.01)
*H01L 21/8238* (2006.01)
*H01L 29/78* (2006.01)
*H01L 29/66* (2006.01)
*H01L 21/265* (2006.01)

(52) U.S. Cl.
CPC *H01L 21/823807* (2013.01); *H01L 21/823814* (2013.01); *H01L 29/66628* (2013.01); *H01L 29/66636* (2013.01); *H01L 29/66795* (2013.01); *H01L 29/785* (2013.01); *H01L 29/7848* (2013.01); *H01L 21/26586* (2013.01)

(58) Field of Classification Search
CPC ............ H01L 29/66795; H01L 29/7831; H01L 29/785; H01L 27/0924; H01L 27/10826; H01L 27/1211; H01L 27/10879; H01L 27/0886; H01L 21/823431; H01L 21/823821; H01L 21/845; H01L 29/41791; H01L 29/66636; H01L 29/7848; H01L 21/823814

USPC .......................................................... 438/481
See application file for complete search history.

(56) References Cited

U.S. PATENT DOCUMENTS

| | | | |
|---|---|---|---|
| 7,618,866 B2 * | 11/2009 | Luo et al. ....................... 438/285 |
| 7,834,399 B2 | 11/2010 | Kanarsky et al. | |
| 7,968,915 B2 | 6/2011 | Kanarsky et al. | |
| 8,173,524 B1 * | 5/2012 | Chakravarti et al. .......... 438/481 |
| 2005/0029601 A1 * | 2/2005 | Chen et al. .................... 257/369 |
| 2005/0156202 A1 * | 7/2005 | Rhee et al. .................... 257/213 |
| 2006/0063332 A1 * | 3/2006 | Doyle et al. .................. 438/267 |
| 2006/0202266 A1 * | 9/2006 | Radosavljevic et al. ...... 257/344 |
| 2007/0026593 A1 * | 2/2007 | Jawarani et al. .............. 438/197 |
| 2007/0145487 A1 * | 6/2007 | Kavalieros et al. ........... 257/368 |

(Continued)

OTHER PUBLICATIONS

Tsung-Lin Lee, Feng Yuan, Chih Chieh Yeh and Wei-Jen Lai; "Gate Structure for Semiconductor Device;" U.S. Appl. No. 13/411,304, filed Mar. 2, 2012; 30 Pages.

(Continued)

*Primary Examiner* — Khiem D Nguyen
*Assistant Examiner* — Pauline Vu
(74) *Attorney, Agent, or Firm* — Haynes and Boone, LLP

(57) ABSTRACT

The present disclosure provides devices and methods which provide for strained epitaxial regions. A method of semiconductor fabrication is provided that includes forming a gate structure over a fin of a semiconductor substrate and forming a recess in the fin adjacent the gate structure. A sidewall of the recess is then altered. Exemplary alterations include having an altered profile, treating the sidewall, and forming a layer on the sidewall. An epitaxial region is then grown in the recess. The epitaxial region interfaces the altered sidewall of the recess and is a strained epitaxial region.

16 Claims, 11 Drawing Sheets

(56) References Cited

U.S. PATENT DOCUMENTS

| | | | |
|---|---|---|---|
| 2008/0048262 A1* | 2/2008 | Lee et al. | 257/347 |
| 2008/0079094 A1* | 4/2008 | Jin et al. | 257/401 |
| 2008/0111199 A1* | 5/2008 | Kim et al. | 257/401 |
| 2008/0265321 A1* | 10/2008 | Yu et al. | 257/344 |
| 2008/0283906 A1* | 11/2008 | Bohr | 257/327 |
| 2009/0039361 A1* | 2/2009 | Li et al. | 257/94 |
| 2009/0075029 A1* | 3/2009 | Thomas et al. | 428/173 |
| 2009/0101942 A1* | 4/2009 | Dyer | 257/288 |
| 2009/0159938 A1* | 6/2009 | Nuttinck et al. | 257/288 |
| 2009/0242944 A1 | 10/2009 | Zhang et al. | |
| 2009/0309133 A1* | 12/2009 | Ito | H01L 21/2686 257/190 |
| 2009/0321828 A1* | 12/2009 | Chen et al. | 257/347 |
| 2010/0093147 A1* | 4/2010 | Liao | H01L 21/28123 438/300 |
| 2010/0252862 A1* | 10/2010 | Ko et al. | 257/192 |
| 2010/0308379 A1* | 12/2010 | Kuan | H01L 21/823807 257/288 |
| 2011/0024837 A1* | 2/2011 | Kang | 257/336 |
| 2011/0084336 A1* | 4/2011 | Luning et al. | 257/347 |
| 2011/0117732 A1* | 5/2011 | Bauer et al. | 438/507 |
| 2011/0147842 A1* | 6/2011 | Cappellani et al. | 257/365 |
| 2011/0220964 A1* | 9/2011 | Shin et al. | 257/183 |
| 2011/0233679 A1* | 9/2011 | Chen et al. | 257/368 |
| 2011/0272739 A1* | 11/2011 | Lee et al. | 257/192 |
| 2011/0287600 A1* | 11/2011 | Cheng | H01L 29/7848 438/299 |
| 2011/0287611 A1* | 11/2011 | Cheng | H01L 21/02532 438/478 |
| 2012/0153387 A1* | 6/2012 | Murthy et al. | 257/335 |
| 2012/0161238 A1* | 6/2012 | Scheiper et al. | 257/368 |
| 2012/0168821 A1* | 7/2012 | Cheng et al. | 257/192 |
| 2012/0211808 A1* | 8/2012 | Wei et al. | 257/288 |
| 2012/0223364 A1* | 9/2012 | Chung | H01L 21/823807 257/192 |

OTHER PUBLICATIONS

Tsung-Lin Lee, Feng Yuan, Hung-Li Chiang and Chih Chieh Yeh; "FinFET Device Having a Strained Region;" U.S. Appl. No. 13/416,926, filed Mar. 9, 2012; 53 Pages.

\* cited by examiner

SEMICONDUCTOR DEVICE HAVING A STRAINED REGION

BACKGROUND

The semiconductor integrated circuit (IC) industry has experienced rapid growth. Over the course of this growth, functional density of the devices has generally increased by the device feature size or geometry has decreased. This scaling down process generally provides benefits by increasing production efficiency, lower costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as finFET devices, because the channel is formed on a "fin" that extends from the substrate. FinFET devices may allow for shrinking the gate width of device while providing a gate on the sides and/or top of the fin including the channel region.

Another manner improving the performance of a semiconductor device is to provide stress or strain to pertinent regions of the device. For example, inducing a higher tensile strain in a region provides for enhanced electron mobility, which may improve performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
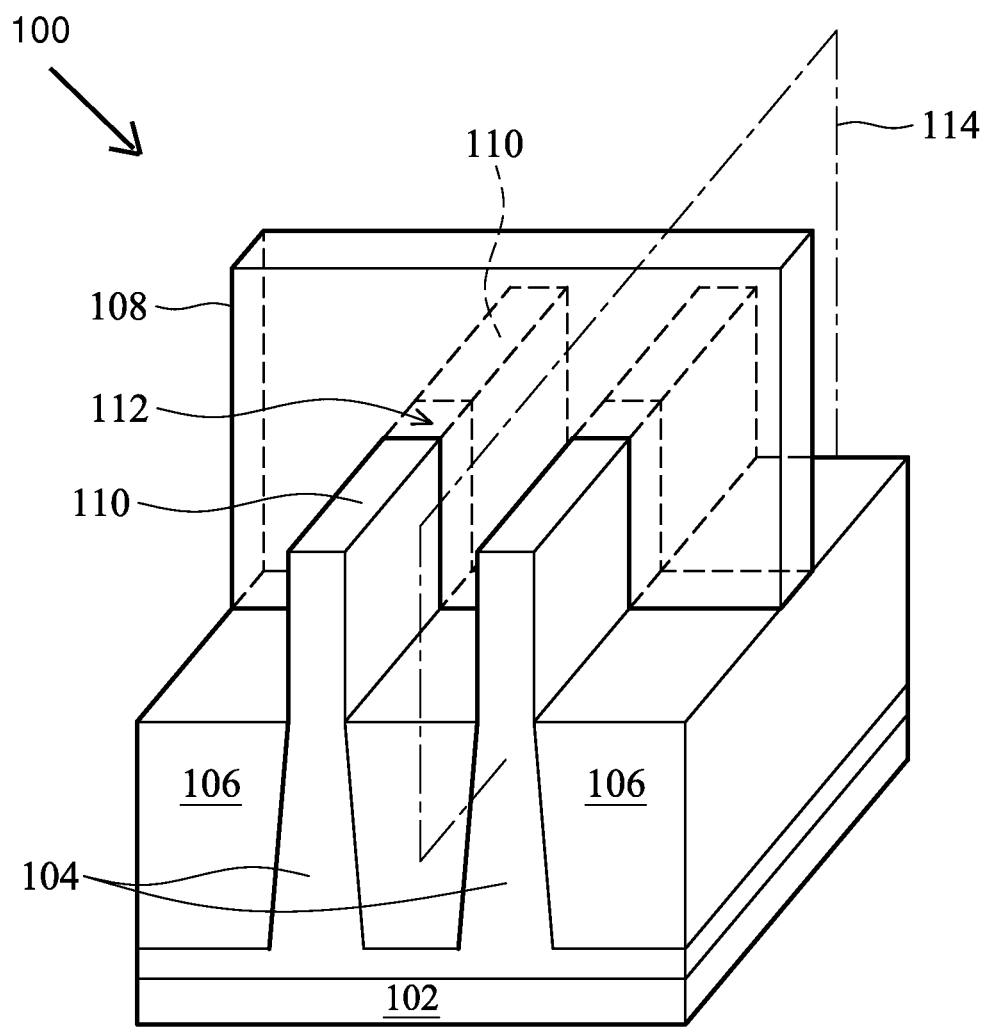
FIG. 1 is perspective view of an embodiment of a semiconductor device.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure may repeat reference numerals and/or letters in the various examples. This repetition is for the purpose of simplicity and clarity and does not in itself dictate a relationship between the various embodiments. In it is understood that those skilled in the art will be able to devise various equivalents that, although not specifically described herein embody the principles of the present disclosure.

It is also noted that the present disclosure presents embodiments in the form of multi-gate transistors or fin-type multi-gate transistors referred to herein as finFET devices. Such a device may include a p-type metal oxide semiconductor fin-FET device or an n-type metal oxide semiconductor fin-FET device. The finFET device may be a dual gate device, tri-gate device, and/or other configuration. Additionally, while the disclosure discusses the examples of finFET devices, the disclosure is not limited to any particular type of device. For example, the methods and devices applied herein may be applied to planar-type MOSFET devices.

Illustrated in FIG. 1 is a semiconductor device 100. The semiconductor device 100 includes finFET type device(s). The semiconductor device 100 may be included in an IC such as a microprocessor, memory device, and/or other IC. The device 100 includes a substrate 102, a plurality of fins 104, a plurality of isolation structures 106, and a gate structure 108 disposed on each of the fins 104. Each of the plurality of fins 104 include a source/drain region denoted 110 where a source or drain feature is formed in, on, and/or surrounding the fin 104. A channel region of the fin 104 underlies the gate structure 108 denoted as 112.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI).

The isolation structures 106 may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures are STI features and are formed by etching trenches in the substrate 102. The trenches may then be filled with isolating material, followed by a chemical mechanical polish (CMP). Other fabrication techniques for the isolation structures 106 and/or the fin structure 104 are possible. The isolation structures 106 may include a multi-layer structure, for example, having one or more liner layers.

The fin structures 104 may provide an active region where one or more devices are formed. In an embodiment, a channel of a transistor device is formed in the fin 104. The fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into the silicon layer, leaving an extending fin. The recesses may be etched using reactive ion etch (RIE) and/or other suitable processes. Numerous other embodiments of methods to form the fins 104 on the substrate 102 may be suitable.

In an embodiment, the fins 104 are approximately 10 nanometer (nm) wide and between approximately 15 nm and 40 nm high. However, it should be understood that other dimensions may be used for the fins 104. The fins 104 may be doped using n-type and/or p-type dopants.

The gate structure 108 may include a gate dielectric layer, a gate electrode layer, and/or one or more additional layers. In an embodiment, the gate structure 108 is a sacrificial gate structure such as formed in a replacement gate process used to form a metal gate structure. In an embodiment, the gate structure 108 includes polysilicon. In an embodiment, the gate structure includes a metal gate structure.

A gate dielectric layer of the gate structure 108 may include silicon dioxide. The silicon oxide may be formed by suitable oxidation and/or deposition methods. Alternatively, the gate dielectric layer of the gate structure 108 may include a high-k dielectric layer such as hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In an embodiment, the gate structure 108 may be a metal gate structure. The metal gate structure may include interfacial layer(s), gate dielectric layer(s), work function layer(s), fill metal layer(s) and/or other suitable materials for a metal gate structure. In other embodiments, the metal gate structure 108 may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), CVD, and/or other suitable dielectric.

Exemplary p-type work function metals that may be included in the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The semiconductor device 100 may include other layers and/or features not specifically illustrated including additional source/drain regions, interlayer dielectric (ILD) layers, contacts, interconnects, and/or other suitable features.

The semiconductor device 100 may benefit in performance from a stress/strain provided on and in the fins 104 in the channel region 112 and/or the source/drain regions 110. In an embodiment, a tensile strain may be generated. The strain may be obtained using one or more of the methods, such as the method 200, the method 900, and/or the method 1900 described below with reference to FIGS. 2, 9, and 19 respectively. In an embodiment, the strain is provided by introducing dislocations into the region of the device.

It is noted that the semiconductor device 100 illustrates a cross-sectional line 114 that indicates the cross-section corresponding to one or more of the embodiments of a device 300, a device 1000, and/or a device 1900, described in detail below.

Figure 2:
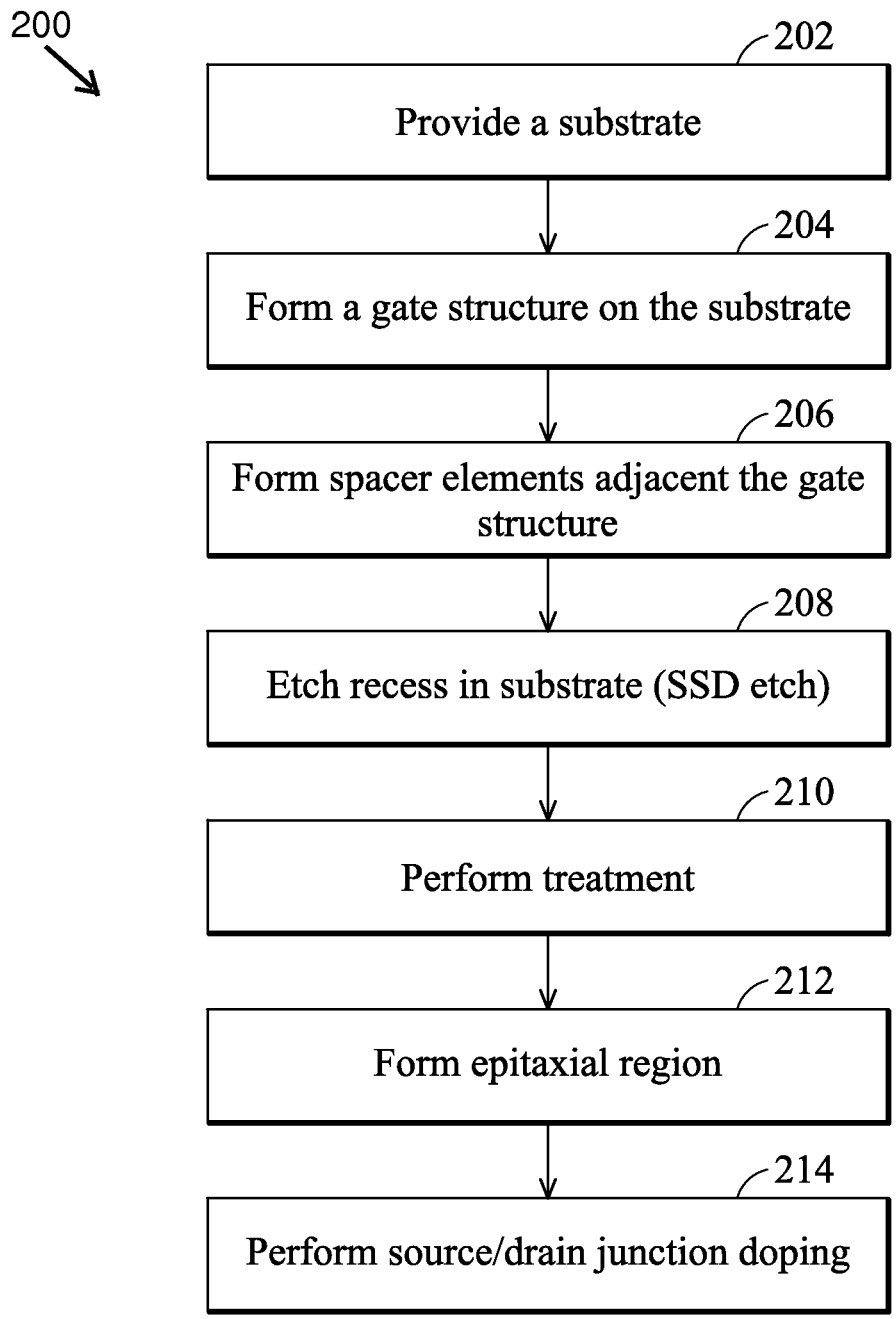
FIG. 2 is a flow chart illustrating an embodiment of a method of forming a semiconductor device according to various aspects of the present disclosure.

Referring now to FIG. 2, illustrated is flow chart of a method 200 of semiconductor fabrication according to one or more aspects of the present disclosure. The method 200 may be implemented to increase a stress or stain provided in one or more regions of a semiconductor device such as a field effect transistor (FET). In an embodiment, the method 200 may be implemented to form a multi-gate fin-type transistor or fin-FET device. In an embodiment, the method 200 may be implemented to form a planar transistor. However, one may recognize other device types that may benefit from the present method. FIGS. 3-8 are cross-sectional views of an embodiment of a semiconductor device 300 fabricated according to steps the method 200 of FIG. 2. It should be understood that FIGS. 3-8 and the device 300 are representative only and not intended to be limiting.

It should be further understood that the method 200 includes steps having features of a complementary metal-oxide-semiconductor (CMOS) technology process flow and thus, are only described briefly herein. Additional steps may be performed before, after and/or during the method 200. Similarly, one may recognize other portions of a device that may benefit from the methods described herein. It is also understood that parts of the semiconductor device 300 may be fabricated by CMOS technology and thus, some processes are only described briefly herein. Further, the semiconductor device 300 may include various other devices and features, such as additional transistors, bipolar junction transistors, resistors, capacitors, diodes, fuses, etc., but is simplified for a better understanding of the inventive concepts of the present disclosure. The semiconductor device 300 may include a plurality of devices interconnected.

The method 200 begins at block 202 where a semiconductor substrate is provided. The semiconductor substrate may be substantially similar to as discussed above with reference to the semiconductor substrate 102 of the semiconductor device 100, described with reference to FIG. 1. In an embodiment, the semiconductor substrate includes a plurality of fins extending from the substrate. An isolation region (e.g., STI feature) may interpose the fins as discussed above with reference to the semiconductor device 100.

Figure 3:
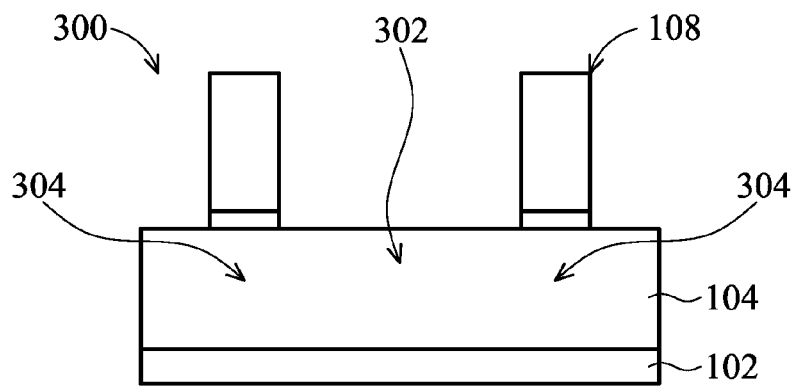
FIGS. 3-8 illustrate cross-sectional views of one embodiment of a semiconductor device at various stages of fabrication according to the method of FIG. 2.
Figure 4:
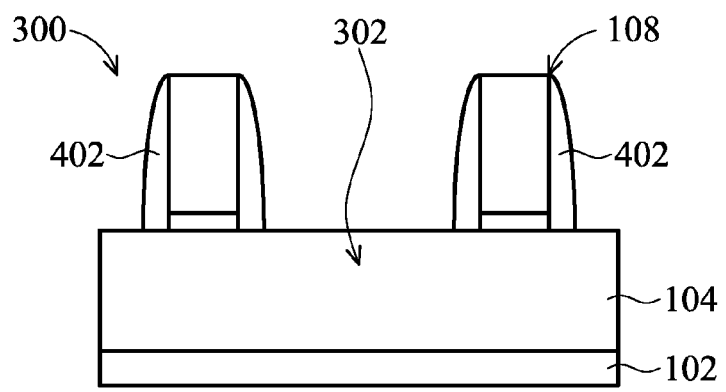
Figure 5:
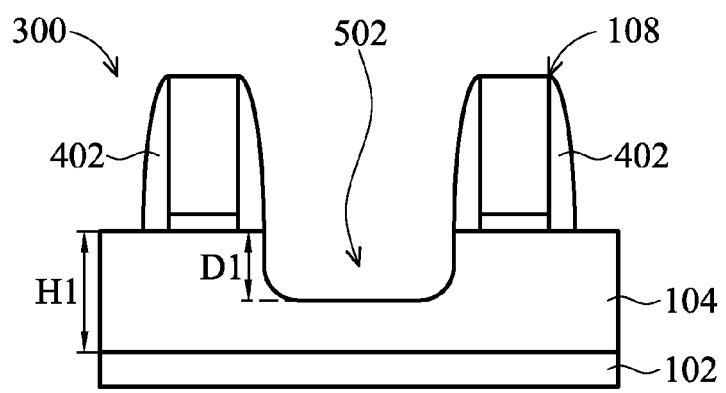

Referring to the example of FIG. 3, a semiconductor device 300 includes a substrate 102 having a fin 104. The semiconductor device 300 may be substantially similar to the semiconductor device 100, described above with reference to FIG. 1. It is noted that the semiconductor device 300 illustrated in FIG. 3 is provided in a view along the axis 114 (e.g., along a fin from source region to drain region).

The method 200 then proceeds to block 204 where a gate structure is formed on the substrate. In an embodiment, the gate structure is formed on and/or around a fin extending from the substrate. The gate structure may include a plurality of layers such as gate dielectric layers, gate electrode layers, capping layers, hard mask layers, and/or other suitable layers. In an embodiment, the gate structure is sacrificial (e.g., includes one or more sacrificial layers) such as provided in a replacement gate method of forming a metal gate structure.

Referring to the example of FIG. 3, a gate structure 108 is disposed on the substrate 102. Specifically, the gate structure 108 is disposed on the fin 104. The gate structure 108 traverses the fin 104, separating a source region from a drain region and defining a channel region. In the semiconductor device 300, the fin 104 is illustrated as including source/drain regions 302 and a channel region 304. The gate structure 108 may be substantially similar to as discussed above with reference to the gate structure 108 of the semiconductor device 100 of FIG. 1.

The method 200 then proceeds to block 206 where spacer elements are formed on the substrate. The spacer elements may abut one or more sidewalls of the gate structure, described above with reference to block 204 of the method 200. The spacer elements may include silicon nitride, silicon oxide, silicon oxynitride, and/or other suitable dielectric. The spacer elements may be formed using suitable deposition and etching techniques. The spacer elements may include a single layer or any plurality of layers. Referring to the example of FIG. 4, sidewall spacers 402 are disposed abutting the sidewalls of the gate structure 108.

It is noted that the prior to the formation of the spacer elements, one or more processes may be performed such as doping processes (e.g., defining the extension or low-dose drain region of the semiconductor device).

The method 200 then proceeds to block 208 where a recess is etched in the fin at one or more of the source and/or drain regions. The recess may be etched using suitable etching technology such as dry etching, plasma etching, wet etching, and the like. In an embodiment, one or more photolithography processes are used to form masking elements such that the remaining regions of the substrate are protected from the etching process. Referring to the example of FIG. 5, a recess 502 is etched in the fin at the source/drain region. The depth D1 of the recess 502 may be +/−10 nanometers (nm) of the fin 104 height H1. The fin height H1 may be between 15 nm and approximately 40 nm.

The method 200 then proceeds to block 210 where a treatment is performed to introduce a strain in or stress onto a region of the semiconductor device. In an embodiment, the treatment is a surface treatment. In an embodiment, the treatment is directed to the sidewalls of the recess formed above in block 208. For example, the treatment of block 210 may introduce dislocations into the fin adjacent the recess formed above in block 208.

In an embodiment, the treatment includes an implant process. The implant process may be a tilt angle pre-amorphous implant. The implant process may include germanium (Ge), silicon (Si), zenon (Xe), carbon (C), and/or other suitable species. The tilt angle may be between approximately 10 degrees and approximately 60 degrees. The implant energy may be between 0.5 keV and approximately 30 keV.

Figure 6:
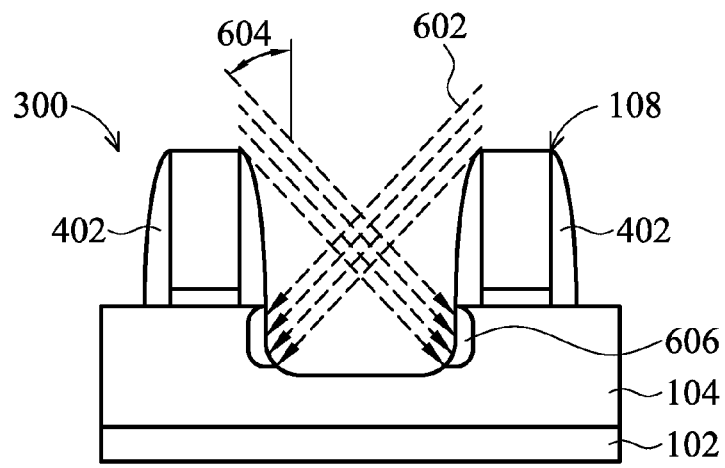
Figure 7:
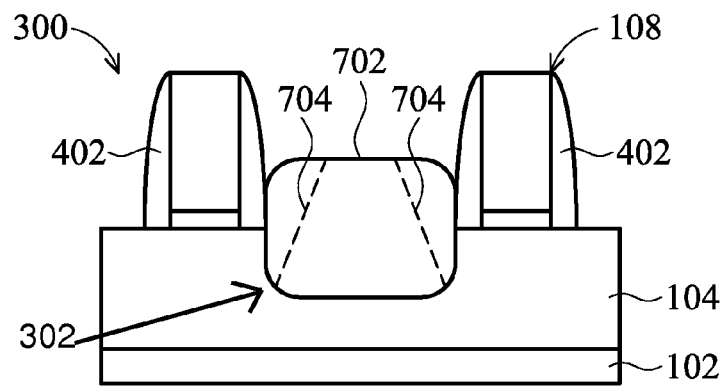
Figure 8:
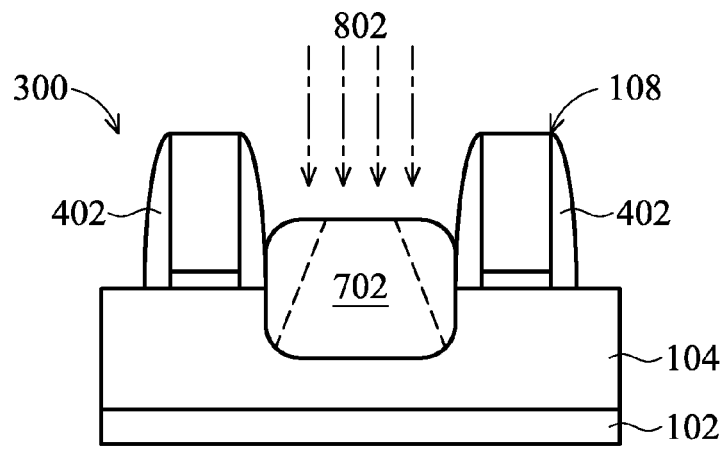

Referring to the example of FIG. 6, a treatment 602 is performed on the sidewalls of the fin 104, providing treated regions 606. The treatment 602 may be at least one of a thermal treatment, an implant process treatment, or a plasma process treatment. It is noted that the bottom wall of the recess 502 is not treated. The treatment 602 is provided at an angle denoted 604. The angle 604 may be between approximately 10 and approximately 60 degrees. The treatment 602 forms a treated region 606 of the fin 104. The treated region 606 is provided on the sidewalls of the recess 502.

The method 200 then proceeds to block 212 where an epitaxial region is grown on the substrate. In an embodiment, the epitaxial region (or epitaxy) is grown in the recessed region of the fin. The epitaxial region may be grown on the treated sidewalls of the recess, described above with reference to block 210. The epitaxial region may be grown by solid-phase epitaxy (SPE). The SPE process may convert an amorphous region of semiconductor material to crystalline structure to form the epitaxial region. In other embodiments, other epitaxial growth processes may be used such as vapor-phase epitaxy. The epitaxial region may include silicon, silicon phosphorus, (SiP), or silicon phosphorus carbide (SiPC). Other exemplary epitaxial compositions include germanium, gallium arsenide, gallium nitride, aluminum gallium indium phosphide, silicon germanium, silicon carbide, and/or other possible compositions. In an embodiment, impurities are added to the epitaxial layer during the growth (e.g., in-situ doping). Exemplary dopants include arsenic, phosphorous, antimony, boron, boron di-fluoride, and/or other possible impurities.

The epitaxial region as formed may be strained as caused by the dislocations present. The dislocations may result from of be introduced by the treatment of block 208 on the sidewalls of region where the epitaxy will be grown. These dislocations may provide for a stress in the as-grown epitaxy region (e.g., a tensile stress). Referring to the example of FIG. 7, an epitaxial region 702 is disposed on the substrate 102. As illustrated, the epitaxial region 702 extends above the fin 104; however other configurations are possible. The epitaxial region 702 may be strained such as described above. The stress/strain is denoted as 704. It is noted that the epitaxial region 702 provides a symmetrical stress to the gate structures 108. In other words, each gate structure 108 may have a channel region 304 that has symmetrical strain due to the epitaxial regions grown on each side of the gate structure 108 (source/drain sides 302). This may allow for a symmetrical stress/strain (e.g., tensile stress) to be provided in the channel region 304 underlying the gate structure 108.

It is noted that the method 200 allows for stress to be provided in the epitaxial region 702 without the additional deposition of an amorphous-silicon or stress memorization film as part of a "stress memorization technique" (SMT) to form dislocations. The epitaxial regions 702 may provide a region for a source/drain feature of the device 300.

The method 200 then proceeds to block 214 where a junction implant may be performed. In other embodiments of the method 200, block 214 is omitted (e.g., the source/drain region may be doped in-situ with the epitaxial growth.) The implantation may include introducing n-type or p-type dopants. Exemplary dopants include arsenic, phosphorous, antimony, boron, boron di-fluoride, and/or other possible impurities. Referring to the example of FIG. 8, a junction implant 802 is illustrated.

The semiconductor device 300 and the method 200 may include further CMOS or MOS technology processing to form various features known in the art. For example, the method 200 may proceed to form main spacers, for example, prior to the junction implant described in block 214 above. Other exemplary processes that may be performed include the formation of contact features, such as silicide regions, may also be formed. The contact features may be coupled to the gate structures 108 and/or the epitaxial regions 702. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate 102 and a chemical mechanical polishing (CMP) process is further applied to the substrate to planarize the substrate. Further, a contact etch stop layer (CESL) may be formed on top of the gate structure 108 before forming the ILD layer.

In an embodiment, a gate electrode layer of the as-formed gate structure 108 remains in the final device (e.g., polysilicon). In another embodiment, a gate replacement process (or gate last process) is performed, where the gate structure 108, or portions thereof, is replaced with a metal gate. For example, a metal gate may replace the gate layer (i.e., polysilicon gate layer) of the gate structure 108. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof. In a gate last process, the CMP process on the ILD layer is continued to expose a top surface of the gate structure 108, and an etching process is performed to remove the gate structure 108 or portions thereof, thereby forming trenches. The trench is then filled with a proper work function metal (e.g., p-type work function metal or n-type work function metal).

Subsequent processing may further form various contacts/vias/lines and multilayer interconnect features (e.g., metal layers and interlayer dielectrics) on the substrate 102, configured to connect the various features or structures of the semiconductor device 300. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a conductive (e.g., copper) related multilayer interconnection structure.

Figure 9:
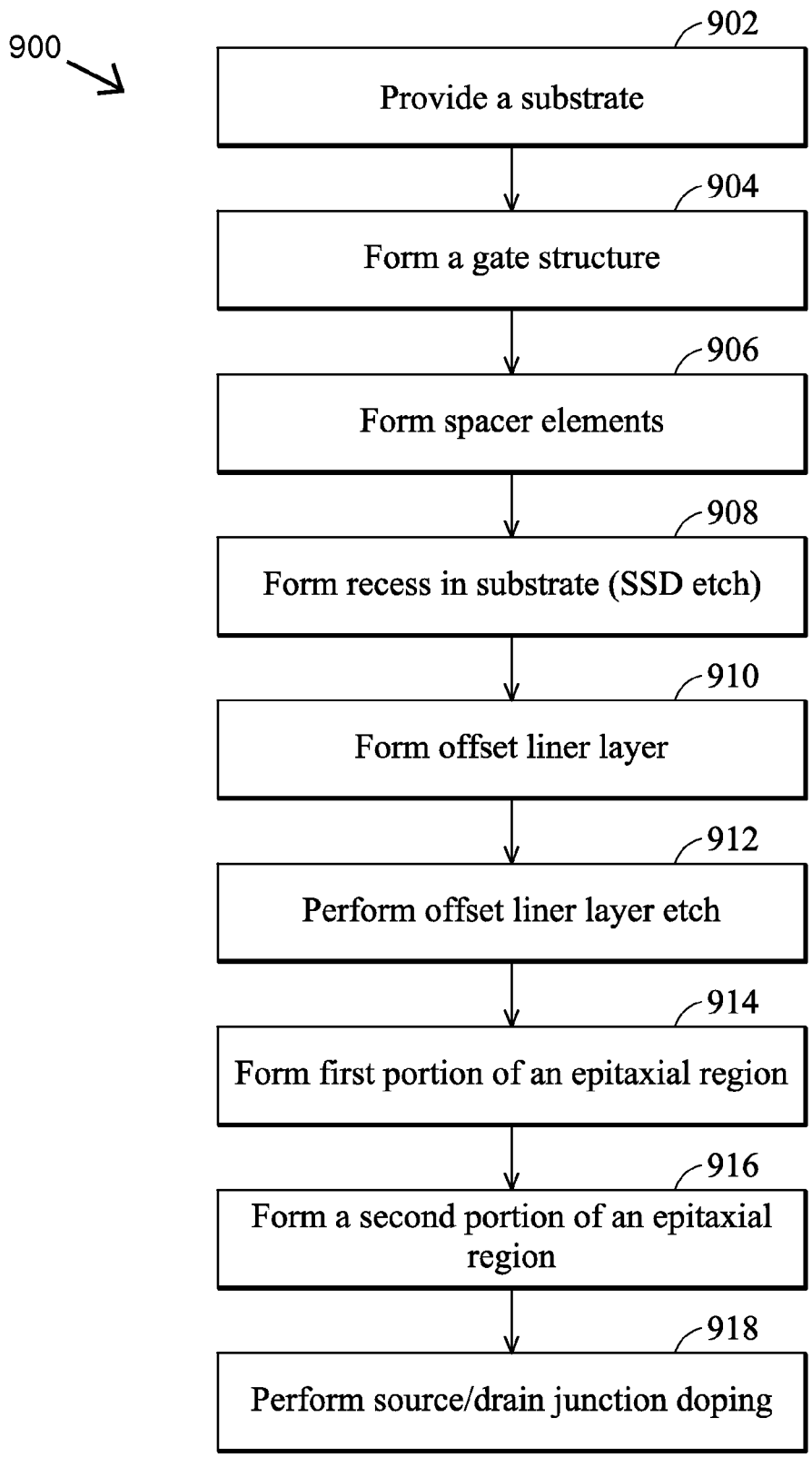
FIG. 9 is a flow chart illustrating another embodiment of a method of forming a semiconductor device according to various aspects of the present disclosure.

Referring now to FIG. 9, illustrated is a flow chart of a method 900 of semiconductor fabrication according to one or more aspects of the present disclosure. The method 900 may be implemented to increase a stress or stain provided in one or more regions of a semiconductor device such as a field effect transistor (FET). In an embodiment, the method 900 may be implemented to form a multi-gate fin-type transistor or finFET device. In an embodiment, the method 900 may be implemented to form a planar transistor. However, one may recognize other device types that may benefit from the present method. FIGS. 10-18 are cross-sectional views of an embodiment of a semiconductor device 1000 fabricated according to steps the method 900 of FIG. 9. It should be understood that FIGS. 10-18 and the device 1000 are representative only and not intended to be limiting.

It should be further understood that the method 900 includes steps having features of a complementary metal-oxide-semiconductor (CMOS) technology process flow and thus, are only described briefly herein. Additional steps may be performed before, after and/or during the method 900. Similarly, one may recognize other portions of a device that may benefit from the methods described herein. It is also understood that parts of the semiconductor device 1000 may be fabricated by CMOS technology and thus, some processes are only described briefly herein. Further, the semiconductor device 1000 may include various other devices and features, such as additional transistors, bipolar junction transistors, resistors, capacitors, diodes, fuses, etc., but is simplified for a better understanding of the inventive concepts of the present disclosure. The semiconductor device 1000 may include a plurality of devices interconnected.

Portions of the method 900, and/or the device 1000, may be substantially similar to the method 200 and device 300, described above, except as discussed herein. Thus, various steps in the method 900 and/or features in the device 1000 will refer to the descriptions above with respect to the method 200 and the device 300.

The method 900 begins at block 902 where a semiconductor substrate is provided. The semiconductor substrate may be substantially similar to as discussed above with reference to the semiconductor substrate 102 of the semiconductor device 100, described with reference to FIG. 1. Block 902 may be substantially similar to block 202, discussed above with reference to the method 200, described with reference to FIG. 2. In an embodiment, the semiconductor substrate includes a plurality of fins extending from the substrate. An isolation region (e.g., STI feature) may interpose the fins as discussed above with reference to the semiconductor device 100.

Figure 10:
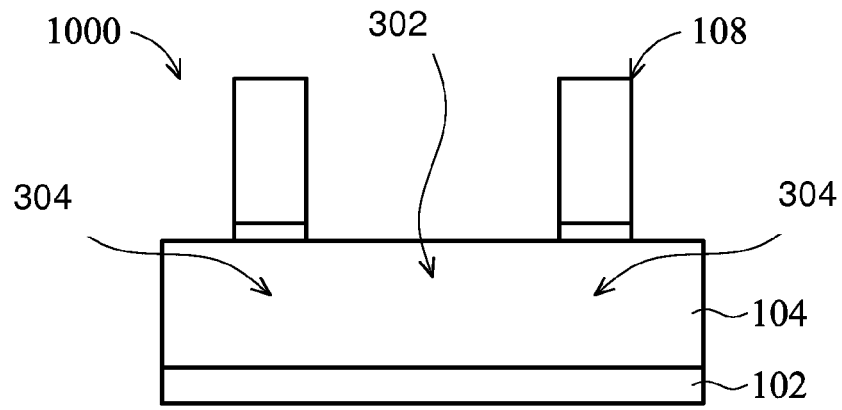
FIGS. 10-18 illustrate cross-sectional views of one embodiment of a semiconductor device at various stages of fabrication according to the method of FIG. 9.
Figure 11:
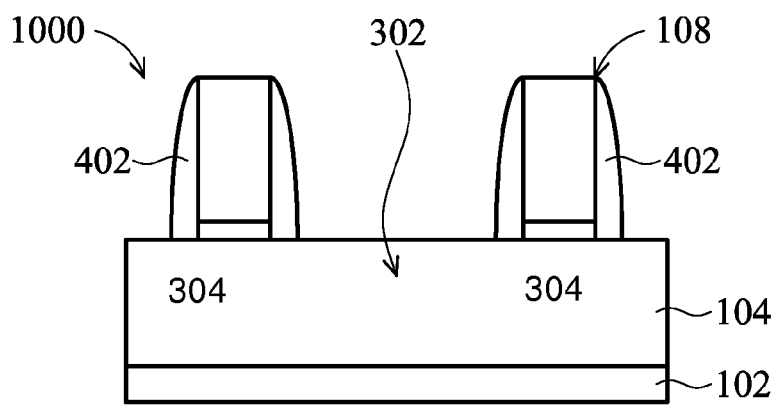
Figure 12:
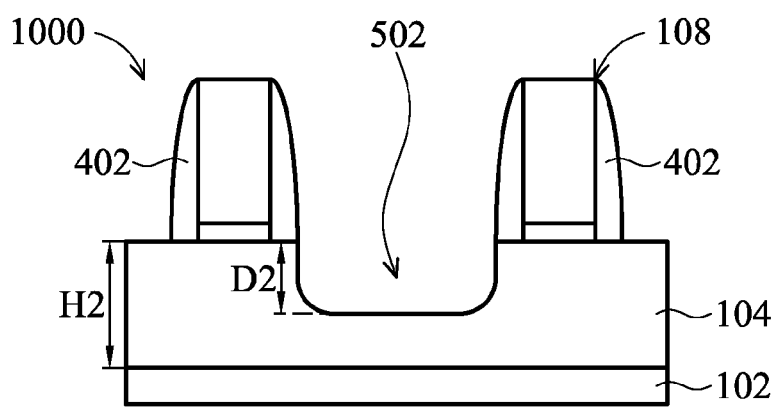

Referring to the example of FIG. 10, a semiconductor device 1000 includes a substrate 102 having a fin 104. The semiconductor device 1000 may be substantially similar to the semiconductor device 100, described above with reference to FIG. 1 and/or the device 300, described above with reference to FIG. 3. It is noted that the semiconductor device 1000 illustrated in FIG. 10 is provided in a view along the axis 114 (e.g., along a fin from source region to drain region).

The method 900 then proceeds to block 904 where a gate structure is formed on the substrate. In an embodiment, the gate structure is formed on and/or around a fin extending from the substrate. The gate structure may include a plurality of layers such as gate dielectric layers, gate electrode layers, capping layers, hard mask layers, and/or other suitable layers. In an embodiment, the gate structure is sacrificial such as provided in a replacement gate method of forming a metal gate structure. The block 904 may be substantially similar to the block 204, described above with reference to the method 200 of FIG. 2.

Referring to the example of FIG. 10, a gate structure 108 is disposed on the substrate 102. Specifically, the gate structure 108 is disposed on the fin 104. The gate structure 108 traverses the fin 104, separating a source region from a drain region and defining a channel region. In the semiconductor device 1000, the fin 104 is illustrated as including source/drain regions 302 and a channel region 304. The gate structure 108 may be substantially similar to as discussed above with reference to the gate structure 108 of the semiconductor device 100 of FIG. 1 and/or the semiconductor device 300 of FIG. 3.

The method 900 then proceeds to block 906 where spacer elements are formed on the substrate. The spacer elements may abut one or more sidewalls of the gate structure, described above with reference to block 904 of the method 900. The spacer elements may include silicon nitride, silicon oxide, silicon oxynitride, and/or other suitable dielectric. The spacer elements may be formed using suitable deposition and etching techniques. Block 906 may be substantially similar to block 206, described above with reference to the method 200 of FIG. 2. Referring to the example of FIG. 11, sidewall spacers 402 are disposed abutting the gate structure 108.

It is noted that the prior to the formation of the spacer elements, one or more processes may be performed such as doping processes (e.g., defining the extension or low-dose drain region of the semiconductor device).

The method 900 then proceeds to block 908 where a recess is etched in the fin at the source and/or drain regions. The recess may be etched using suitable etching technology such as dry etching, plasma etching, wet etching, and the like. In an embodiment, one or more photolithography processes are used to form masking elements such that the remaining regions of the substrate are protected from the etching process. Block 908 may be substantially similar to block 208 of the method 200, described above with reference to FIG. 2. Referring to the example of FIG. 12, a recess 502 is etched in the fin at the source/drain region. The recess 502 has a depth D2 that is within 10 nm (+/−) of the fin 104 height H2. The fin 104 height H2 may be between approximately 15 nm and approximately 40 nm.

The method 900 then proceeds to block 910 where an offset liner layer is formed. The offset liner layer may be a suitable dielectric composition. Exemplary materials include silicon oxide, silicon nitride, silicon oxynitride, and/or other dielectrics. The offset liner layer may be formed by chemical vapor deposition, oxidation, and/or other suitable formation methods. The offset liner layer may be between approximately 5 nm and approximately 20 nm in thickness.

In an embodiment, the offset liner layer is deposited as a conformal coating overlying the substrate (e.g., including the gate structures). In another embodiment, the offset liner layer is formed by a thermal oxidation process and is formed on the walls of the recess, described above with reference to block 908. In such an embodiment, the offset liner layer may not be formed on the exposed surfaces of the gate structure (and/or spacer elements), described above with reference to block 904 (and block 906).

Figure 13:
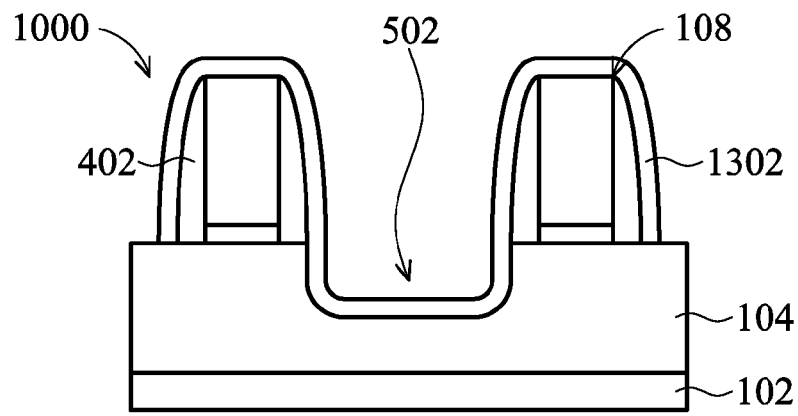
Figure 14:
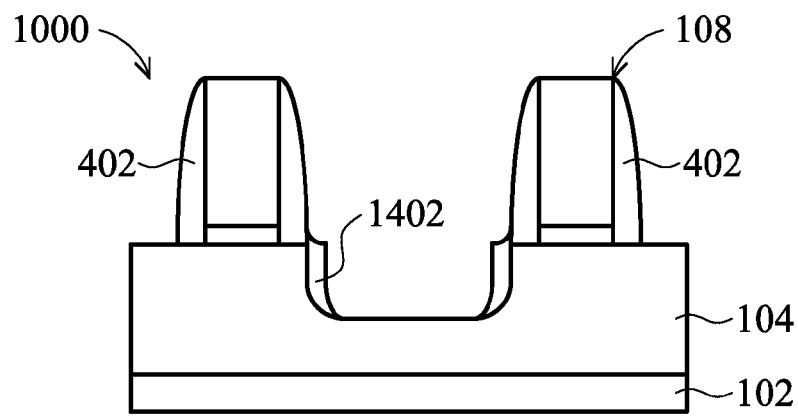
Figure 15:
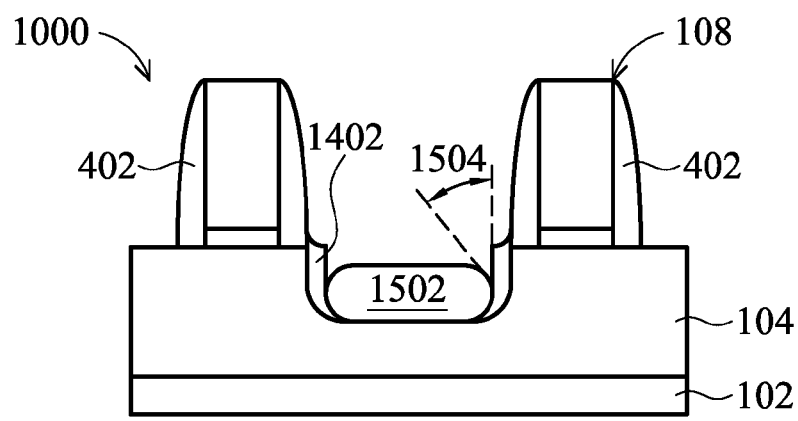
Figure 16:
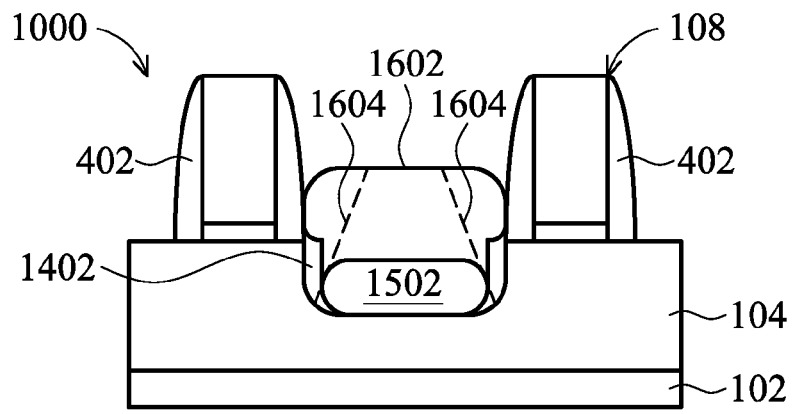

Referring to the example of FIG. 13, an offset liner layer 1302 is formed on the substrate 102 in the recess 502. The offset liner layer 1302 is illustrated as a conformal layer, however, other embodiments are possible including, for example, a liner layer that is grown on the exposed portions of the fin 104 (e.g., the recess 502 walls).

The method 900 then proceeds to block 912 where the offset liner layer is etched. The offset liner layer may be etched using suitable etching processes such as, dry etch, plasma etch, wet etch, and/or other suitable processes. In embodiments, one or more photolithography processes define the region to be etched using suitable masking elements. The offset liner layer may be etched such that it is removed from a bottom portion of the recess, while remaining on the sidewalls of the recess. Referring to the example of FIG. 14, the offset liner layer 1302 (see FIG. 13) has been etched to form etched offset liner 1402.

The method 900 then proceeds to block 914 where a first portion of an epitaxial region is grown on the substrate. In an embodiment, the first portion of the epitaxial region is grown in the recessed region of the fin.

Figure 17:
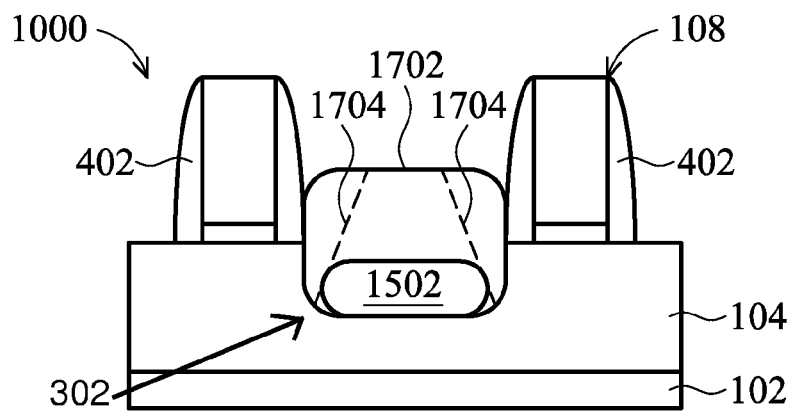
Figure 18:
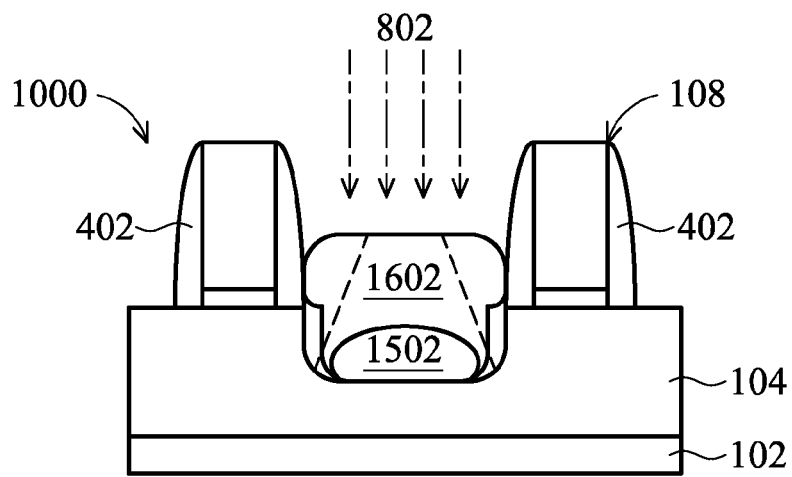

In an embodiment, the epitaxial region includes a first and second portion (as discussed in block 916), which may be grown in the same or different epitaxy processes and include the same or different epitaxial compositions. In other words, though described herein in to "blocks" of the method 200, the growth processes described in block 914 and 916 may be performed in a single epitaxial growth process. For example, as illustrated in the embodiment of FIG. 17.

The first portion of epitaxial region may be grown such that it extends from the exposed bottom portion of the recess and provides an interface with the etched offset liner, described above with reference to block 912. Referring to the example of FIG. 15, a first portion of an epitaxial region 1502 is illustrated. The first portion 1502 is disposed on the bottom region of the recess 502, where it contacts the semiconductor material of the fin 104. The sides of the first portion 1502 interface the etched offset liner 1402. An angle 1504 is provided between the offset liner 1402 and the first portion 1502. The angle 1504 may be less than approximately 90 degrees.

The first portion of the epitaxial region may be grown by solid-phase epitaxy (SPE). The SPE process may convert an amorphous region of semiconductor material to crystalline structure to form the epitaxial region. In other embodiments, other epitaxial growth processes may be used such as vapor-phase epitaxy. The epitaxial region may include silicon, germanium, gallium arsenide, gallium nitride, aluminum gallium indium phosphide, silicon germanium, silicon carbide, and/or other possible compositions. In an embodiment, impurities are added to the epitaxial layer during the growth (e.g., in-situ doping). Exemplary dopants include arsenic, phosphorous, antimony, boron, boron di-fluoride, and/or other possible impurities.

The method 900 then proceeds to block 916 where a second portion of the epitaxial region is grown. As discussed above, in an embodiment, block 916 and block 914 may be provided in a single epitaxial growth process. In other embodiments, block 914 and block 916 may include two distinct epitaxial growth processes, for example, separated by one or more processes.

In an embodiment, after the first portion of the epitaxial region is formed (block 914) a second portion of the epitaxial region is formed during the same growth process. For example, the epitaxial process described above may continue to from a second epitaxial region overlying the first epitaxial region. In such an embodiment, the etched offset liner remains on the substrate. Referring to the example of FIG. 16, a second portion 1602 of the epitaxial region is disposed on the first portion of the epitaxial region 1502. The first portion 1502 and the second portion 1602 may include the same composition (e.g., silicon, silicon germanium, etc). In other embodiments, the first portion 1502 and the second portion 1602 may include a different composition or doping profiles.

The epitaxial region as formed may be strained. For example, stress may be caused by the dislocations present in forming second portion of the epitaxial region with a profile defined by a less than 90 degree angle (e.g., angle 1504). Thus, the dislocations may result from the presence of the etched offset liner defining the profile. These dislocations may provide for a stress in the as-grown epitaxy region (e.g., a tensile stress). Referring to the example of FIG. 16, the stress/strain is denoted as 1604. It is noted that the epitaxial region including the first portion 1502 and the second portion 1602 provides a symmetrical stress to the gate structures 108. In other words, each gate structure 108 will have a channel region that has symmetrical strain due to the epitaxial regions grown on each side (e.g., source/drain region 302) of the gate structure 108. This may allow for a symmetrical stress/strain (e.g., tensile stress) to be provided in the channel region 304 underlying the gate structure 108.

The second portion 1602 (of the epitaxial region) has a crescent shape. For example, the portion 1602 has a top surface (e.g., lying at or above the fin 104 surface) and a bottom surface which interfaces with the first portion of the epitaxy region 1502 (and the etched offset liner 1402). The bottom surface has a concave shape. For example, the second portion 1602 extends to two terminal end points defined by the first portion 1502 and the etched offset liner 1402.

In an embodiment, after the first portion of the epitaxial region is formed (block 914) the etched offset liner is removed from the substrate. The etched offset liner may be removed using wet etch, dry etch, plasma etch, and/or other suitable stripping processes. Referring to the example of FIG. 17, the etched offset liner 1402 has been removed from the substrate 102.

In a further embodiment, after the removal of the etched offset liner, a second portion of the epitaxial region is formed. The second portion of the epitaxial region may be grown by solid-phase epitaxy (SPE). The SPE process may convert an amorphous region of semiconductor material to crystalline structure to form the epitaxial region. In other embodiments, other epitaxial growth processes may be used such as vapor-phase epitaxy. The epitaxial region may include silicon, germanium, gallium arsenide, gallium nitride, aluminum gallium indium phosphide, silicon germanium, silicon carbide, and/or other possible compositions. In an embodiment, impurities are added to the epitaxial layer during the growth (e.g., in-situ doping). Exemplary dopants include arsenic, phosphorous, antimony, boron, boron di-fluoride, and/or other possible impurities.

Referring to the example of FIG. 17, a second portion 1702 of the epitaxial region is disposed on the first portion of the epitaxial region 1502. The first portion 1502 and the second portion 1702 may include the same composition (e.g., silicon, silicon germanium, etc). In other embodiments, the first portion 1502 and the second portion 1702 may include different compositions and/or different doping profiles.

The epitaxial region as formed may be strained as caused by the dislocations present. The dislocations may result from the presence of the etched offset liner and the profile (opening) defined by the offset liner (e.g., angle 1504 of FIG. 15). These dislocations may provide for a stress in the as-grown epitaxy region (e.g., a tensile stress). Referring to the example of FIG. 17, the stress/strain is denoted as 1704. It is noted that the epitaxial region including the first portion 1502 and the second portion 1702 provides a symmetrical stress to the gate structures 108. In other words, each gate structure 108 will have a channel region that has symmetrical strain due to the epitaxial regions grown on each side (e.g., source/drain 302). This may allow for a symmetrical stress/strain (e.g., tensile stress) to be provided in the channel region 304 underlying the gate structure 108.

The second portion 1702 (of the epitaxial region) has a crescent shape. For example, the portion 1702 has a top surface (e.g., lying at or above the fin 104 surface) and a bottom surface which interfaces with the first portion of the epitaxy region 1502. The bottom surface has a concave shape. For example, the second portion 1702 extends to two terminal end points defined by the first portion 1502 and the fin 104.

It is noted that the method 900 allows for stress to be provided in the epitaxial region including the first portion 1502 and the second portion 1702 or 1602 without the additional deposition of an amorphous-silicon or stress memorization film as part of a "stress memorization technique" (SMT) to form dislocations.

The method 900 then proceeds to block 918 where a junction implant may be performed. Block 918 may be substantially similar to block 214, described above with reference to the method 200 of FIG. 2. In other embodiments of the method 900, block 914 is omitted (e.g., the source/drain region may be doped in-situ with the epitaxial growth.) The implantation may include introducing n-type or p-type dopants. Exemplary dopants include arsenic, phosphorous, antimony, boron, boron di-fluoride, and/or other possible impurities. Referring to the example of FIG. 18, a junction implant 802 is illustrated.

The semiconductor device 1000 and the method 900 may include further CMOS or MOS technology processing to form various features known in the art. For example, the method 900 may proceed to form main spacers, for example, prior to the junction implant described in block 918 above. Other exemplary processes that may be performed include the formation of contact features, such as silicide regions, may also be formed. The contact features may be coupled to the gate structures 108 and/or the second portion of the epitaxial regions 1602/1702. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate 102 and a chemical mechanical polishing (CMP) process is further applied to the substrate to planarize the substrate. Further, a contact etch stop layer (CESL) may be formed on top of the gate structure 102 before forming the ILD layer.

In an embodiment, the gate structure 108 remains in the final device (e.g., polysilicon). In another embodiment, a gate replacement process (or gate last process) is performed, where the gate structure 108, or portions thereof, is replaced with a metal gate. For example, a metal gate may replace the gate layer (i.e., polysilicon gate layer) of the gate structure 108. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof. In a gate last process, the CMP process on the ILD layer is continued to expose a top surface of the gate structure 108, and an etching process is performed to remove the gate structure 108 or portions thereof, thereby forming trenches. The trench is then filled with a proper work function metal (e.g., p-type work function metal or n-type work function metal).

Subsequent processing may further form various contacts/vias/lines and multilayer interconnect features (e.g., metal layers and interlayer dielectrics) on the substrate 102, configured to connect the various features or structures of the semiconductor device 1000. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a conductive (e.g., copper) related multilayer interconnection structure.

Figure 19:
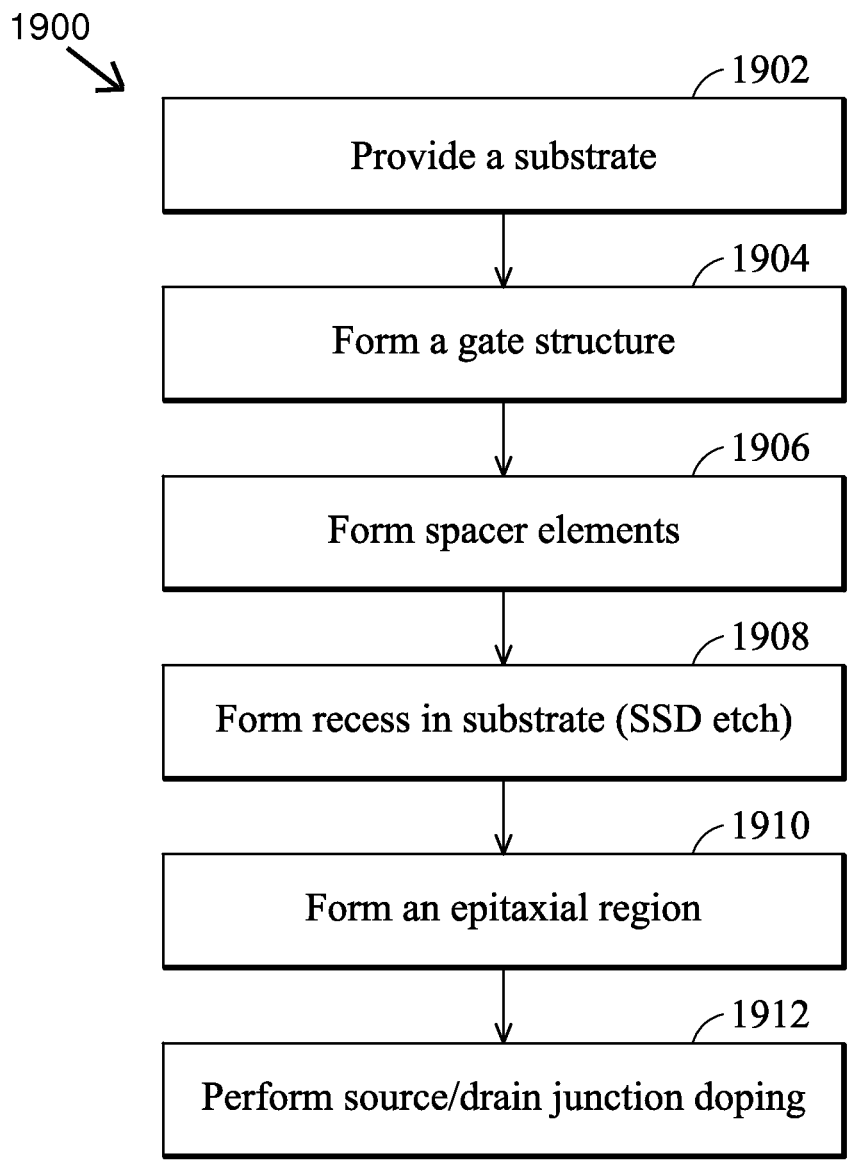
FIG. 19 is a flow chart illustrating another embodiment of a method of forming a semiconductor device according to various aspects of the present disclosure.

Referring now to FIG. 19, illustrated is a flow chart of a method 1900 of semiconductor fabrication according to one or more aspects of the present disclosure. The method 1900 may be implemented to increase a stress or stain provided in one or more regions of a semiconductor device such as source/drain region of a field effect transistor (FET). In an embodiment, the method 1900 may be implemented to form a multi-gate fin-type transistor or finFET device. In an embodiment, the method 1900 may be implemented to form a planar transistor. However, one may recognize other device types that may benefit from the present method. FIGS. 20-24 are cross-sectional views of an embodiment of a semiconductor device 2000 fabricated according to steps the method 1900 of FIG. 19. It should be understood that FIGS. 20-24 and the device 2000 are representative only and not intended to be limiting.

It should be further understood that the method 1900 includes steps having features of a complementary metal-oxide-semiconductor (CMOS) technology process flow and thus, are only described briefly herein. Additional steps may be performed before, after and/or during the method 900. Similarly, one may recognize other portions of a device that may benefit from the methods described herein. It is also understood that parts of the semiconductor device 1000 may be fabricated by CMOS technology and thus, some processes are only described briefly herein. Further, the semiconductor device 2000 may include various other devices and features, such as additional transistors, bipolar junction transistors, resistors, capacitors, diodes, fuses, etc., but is simplified for a better understanding of the inventive concepts of the present disclosure. The semiconductor device 2000 may include a plurality of devices interconnected.

Portions of the method 1900, and/or the device 2000, may be substantially similar to the method 200 and device 300, described above, and/or the method 900 and the device 1000, except as discussed herein. Thus, various steps in the method 1900 and/or features in the device 2000 will refer to the descriptions above with respect to the method 200 and the device 300 and/or the method 900 and the device 1000.

The method 1900 begins at block 1902 where a semiconductor substrate is provided. The semiconductor substrate may be substantially similar to as discussed above with reference to the semiconductor substrate 102 of the semiconductor device 100, described with reference to FIG. 1. Block 1902 may be substantially similar to block 202, discussed above with reference to the method 200, described with reference to FIG. 2 and/or substantially similar to block 902, discussed above with reference to the method 900, described with reference to FIG. 9.

Figure 20:
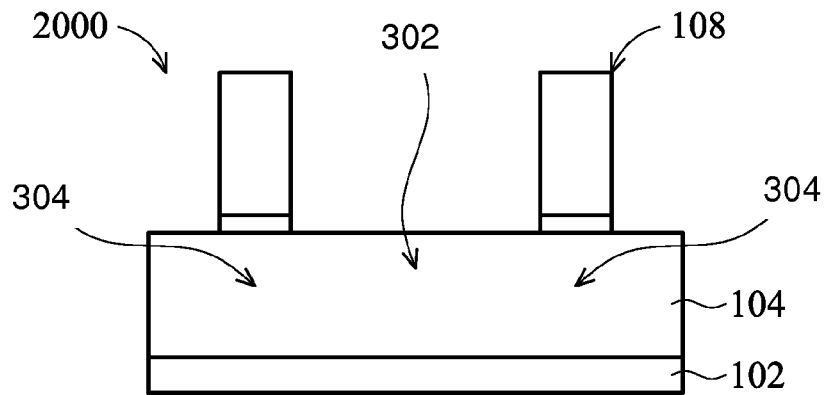
FIGS. 20-24 illustrate cross-sectional views of one embodiment of a semiconductor device at various stages of fabrication according to the method of FIG. 19.
Figure 21:
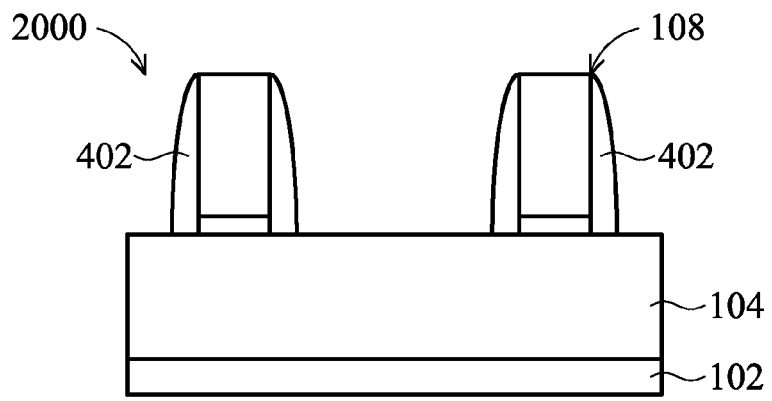
Figure 22:
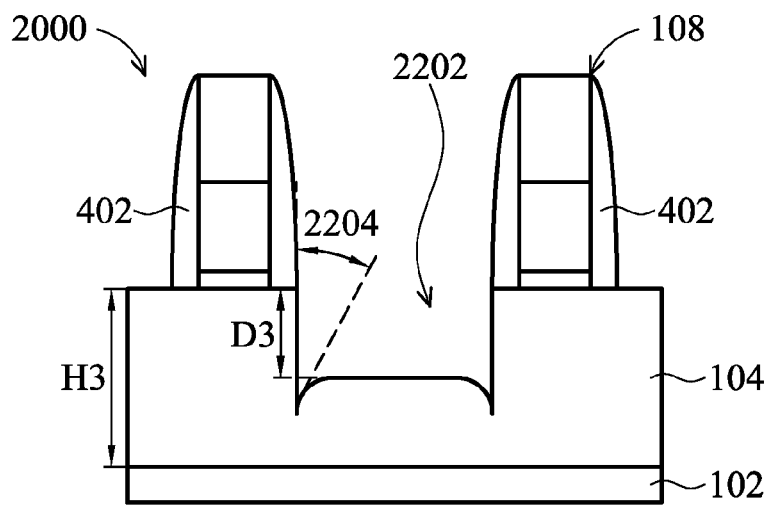
Figure 23:
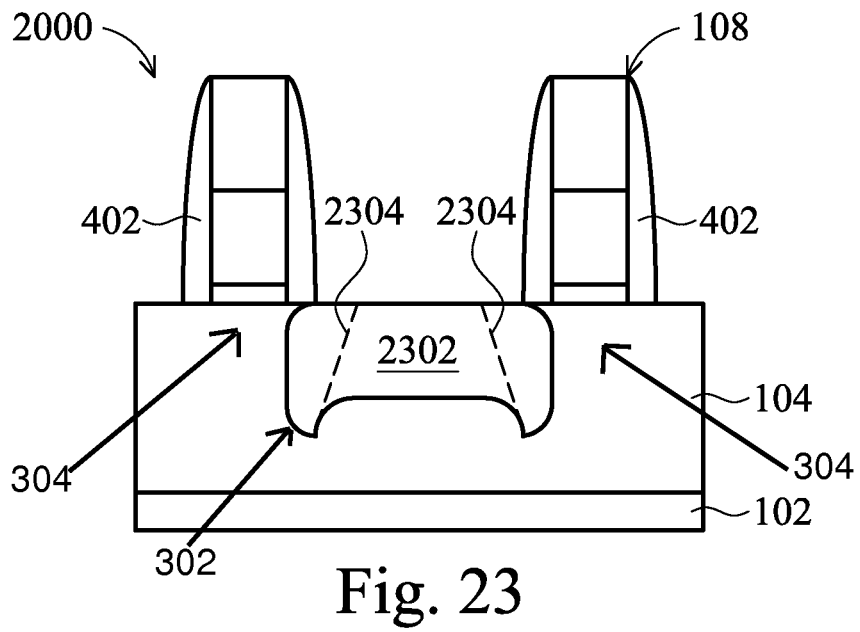
Figure 24:
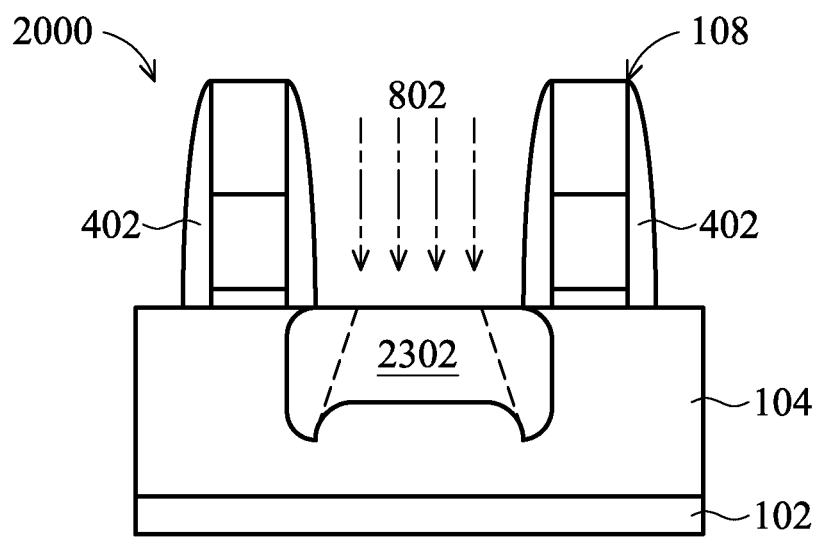

Referring to the example of FIG. 20, a semiconductor device 2000 includes a substrate 102 having a fin 104. The semiconductor device 2000 may be substantially similar to the semiconductor device 100, described above with reference to FIG. 1, the device 300, described above with reference to FIG. 3, and/or the device 1000, described above with reference to FIG. 10. It is noted that the semiconductor device 2000 illustrated in FIG. 20 is provided in a view along the axis 114 (e.g., along a fin from source region to drain region).

The method 1900 then proceeds to block 1904 where a gate structure is formed on the substrate. In an embodiment, the gate structure is formed on and/or around a fin extending from the substrate. The block 1904 may be substantially similar to the block 204, described above with reference to the method 200 of FIG. 2 and/or may be substantially similar to the block 904, described above with reference to the method 900 of FIG. 9.

Referring to the example of FIG. 20, a gate structure 108 is disposed on the substrate 102. Specifically, the gate structure 108 is disposed on the fin 104. The gate structure 108 traverses the fin 104, separating a source region from a drain region and defining a channel region. In the semiconductor device 2000, the fin 104 is illustrated as including source/drain regions 302 and channel region 306. The gate structure 108 may be substantially similar to as discussed above with reference to the gate structure 108 of the semiconductor device 100 of FIG. 1, the semiconductor device 300 of FIG. 3, and/or the semiconductor device 1000 of FIG. 10.

The method 1900 then proceeds to block 1906 where spacer elements are formed on the substrate. The spacer elements may abut one or more sidewalls of the gate structure, described above with reference to block 1904 of the method 1900. Block 1906 may be substantially similar to block 206, described above with reference to the method 200 of FIG. 2 and/or substantially similar to block 906, described above with reference to the method 900 of FIG. 9. Referring to the example of FIG. 21, sidewall spacers 402 are disposed abutting the gate structure 108.

It is noted that the prior to the formation of the spacer elements, one or more processes may be performed such as doping processes (e.g., defining the extension or low-dose drain region of the semiconductor device).

The method 1900 then proceeds to block 1908 where a recess is etched in the fin at the source and/or drain regions. The recess may be etched using suitable etching technology such as dry etching, plasma etching and/or other suitable processes. The recess may be formed such that it has corners defined by an angle of less than approximately 90 degrees. Referring to the example of FIG. 22, a recess 2202 is etched in the fin at the source/drain region. The recess 2202 includes a profile having an angle 2204. In an embodiment, the angle 2204 is less than approximately 90 degrees. In an embodiment, the fin 104 has a height H3 between approximately 15 nm and approximately 40 nm. In an embodiment, the recess 2202 has a depth D3 that is within +/−10 nm of the height H3 of the fin 104.

The method 1900 then proceeds to block 1910 where an epitaxial region is grown on the substrate. In an embodiment, the epitaxial region is grown in the recessed region of the fin.

The epitaxial region may be grown such that it extends from the exposed bottom portion of the recess and substantially and/or completely fills the recess. Referring to the example of FIG. 23, an epitaxial region 2302 is illustrated.

The epitaxial region 2302 may be referred to as having a crescent shape. For example, the epitaxial region 2302 has a top surface (e.g., lying at (or above) the fin 104 surface) and a bottom surface which interfaces with fin 104. The bottom surface has a concave shape. For example, the epitaxial region 2302 extends to two terminal end points defined by the etched recess in the fin 104.

The epitaxial region may be grown by solid-phase epitaxy (SPE). The SPE process may convert an amorphous region of semiconductor material to crystalline structure to form the epitaxial region. In other embodiments, other epitaxial growth processes may be used such as vapor-phase epitaxy. The epitaxial region may include silicon, germanium, gallium arsenide, gallium nitride, aluminum gallium indium phosphide, silicon germanium, silicon carbide, and/or other possible compositions. In an embodiment, impurities are added to the epitaxial layer during the growth (e.g., in-situ doping). Exemplary dopants include arsenic, phosphorous, antimony, boron, boron di-fluoride, and/or other possible impurities.

The epitaxial region as formed may be strained as caused by the dislocations present. The dislocations may result from the presence the profile of the recess in the fin. These dislocations may provide for a stress in the as-grown epitaxy region (e.g., a tensile stress). Referring to the example of FIG. 23, the stress/strain is denoted as 2304. It is noted that the epitaxial region 2302 provides a symmetrical stress to the gate structures 108. In other words, each gate structure 108 will have a channel region that has symmetrical strain due to the epitaxial regions grown on each side (e.g., source/drain 302) of the gate structure 108. This may allow for a symmetrical stress/strain (e.g., tensile stress) to be provided in the channel region 304 underlying the gate structure 108.

It is noted that the method 1900 allows for stress to be provided in the epitaxial region 2302 without the additional deposition of an amorphous-silicon or stress memorization film as part of a "stress memorization technique" (SMT) to form dislocations.

The method 1900 then proceeds to block 1912 where a junction implant may be performed. Block 1912 may be substantially similar to block 214, described above with reference to the method 200 of FIG. 2, and/or block 918 of the method 900 described in FIG. 9. In other embodiments of the method 1900, block 1914 is omitted (e.g., the source/drain region may be doped in-situ with the epitaxial growth.) The implantation may include introducing n-type or p-type dopants. Exemplary dopants include arsenic, phosphorous, antimony, boron, boron di-fluoride, and/or other possible impurities. Referring to the example of FIG. 24, a junction implant 802 is illustrated.

The semiconductor device 2000 and the method 1900 may include further CMOS or MOS technology processing to form various features known in the art. For example, the method 1900 may proceed to form main spacers, for example, prior to the junction implant described in block 1912 above. Other exemplary processes that may be performed include the formation of contact features, such as silicide regions, may also be formed. The contact features may be coupled to the gate structures 108 and/or the second portion of the epitaxial region 2302. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate 102 and a chemical mechanical polishing (CMP) process is further applied to the substrate to planarize the substrate. Further, a contact etch stop layer (CESL) may be formed on top of the gate structure 108 before forming the ILD layer.

In an embodiment, the gate structure 108 remains in the final device (e.g., polysilicon). In another embodiment, a gate replacement process (or gate last process) is performed, where the gate structure 108, or portions thereof, is replaced with a metal gate. For example, a metal gate may replace the gate layer (i.e., polysilicon gate layer) of the gate structure 108. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof. In a gate last process, the CMP process on the ILD layer is continued to expose a top surface of the gate structure 108, and an etching process is performed to remove the gate structure 108 or portions thereof, thereby forming trenches. The trench is then filled with a proper work function metal (e.g., p-type work function metal or n-type work function metal).

Subsequent processing may further form various contacts/vias/lines and multilayer interconnect features (e.g., metal layers and interlayer dielectrics) on the substrate 102, configured to connect the various features or structures of the semiconductor device 1000. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a conductive (e.g., copper) related multilayer interconnection structure.

In summary, the methods and devices disclosed herein provide for a strained region of a device. In an embodiment, the methods and devices provide for a strained source/drain region of the device. The methods and devices provide for the strain by introducing dislocations into an epitaxially grown region through altering of the sidewalls of an etched recess in which the epitaxy is grown. The altering may include performing a treatment on the sidewalls, such as a thermal, ion implantation or plasma treatment, formation of an offset liner layer on the sidewalls thus, changing the profile of the opening in which the epitaxy is grown, and/or providing profile of the etched recess that includes a "corner" of less than approximately 90 degrees.

It is understood that different embodiments disclosed herein offer different disclosure, and that they may make various changes, substitutions and alterations herein without departing from the spirit and scope of the present disclosure. For example, the embodiments disclosed herein may be applied to formation of a region of a planar transistor (e.g., source/drain region) of a planar MOSFET.

Thus, it will be appreciated that a method is described that includes providing a substrate having a fin and forming a gate structure over the fin. A recess in the fin adjacent the gate structure (e.g., adjacent a channel region of the fin). The sidewall of the recess may be altered after or during the formation of the recess. An epitaxial region is then grown in the recess. The epitaxial region interfaces the altered sidewall of the recess and is a strained epitaxial region. Exemplary alterations of the recess include treatment of the sidewalls of the recess, formation of a layer on the sidewalls of the recess, and/or providing a profile of the recess that includes an angled corner less than 90 degrees.

What is claimed is:

1. A method of semiconductor fabrication, comprising:
providing a substrate having a semiconductor fin;
forming a gate structure over the semiconductor fin;
forming a recess in the semiconductor fin adjacent the gate structure, wherein the recess is defined by a first sidewall, an opposing second sidewall and a bottom surface extending from the first sidewall to the opposing second sidewall, and wherein each of the first sidewall, the opposing second sidewall, and the bottom surface are interfaces with the semiconductor fin;
altering the first sidewall of the recess and the opposing second sidewall of the recess by forming a dielectric offset liner layer on the first and opposing second sidewalls of the recess; and
growing a first epitaxial region in the recess, wherein the first epitaxial region interfaces a first surface and an opposing second surface of the dielectric offset liner layer and wherein the first epitaxial region is a strained epitaxial region, and wherein the first epitaxial region extends to a first height and the dielectric offset liner layer extends to a second height, the second height being greater than the first height such that an angle defined by an intersection between a top surface of the first epitaxial region and the first surface of the dielectric offset liner layer is less than 90 degrees; and after the growing of the first epitaxial region, removing the dielectric offset liner layer including the first surface and the opposing second surface of the dielectric offset liner layer; and growing a second epitaxial region on and over the first epitaxial region after removing the dielectric offset liner layer.

2. The method of claim 1, wherein the altering the first and opposing second sidewalls of the recess includes forming the dielectric offset liner layer by growing a dielectric material on the first and opposing second sidewalls of the recess.

3. A method of fabricating a semiconductor device, comprising:

forming a recess in a substrate of semiconductor material, wherein the recess is defined by a first sidewall of the semiconductor material, a second sidewall of the semiconductor material, and a bottom surface of the semiconductor material;

forming an offset liner layer on the first and second sidewalls of the recess, wherein the offset liner layer has interfaces with the semiconductor material on the first and second sidewalls of the recess; wherein the offset liner layer has a dielectric composition; and growing a first epitaxial region in the bottom surface and in a bottom portion of the recess, wherein a top portion of the recess above the first epitaxial region is vacant after the growing the first epitaxial region, wherein the growing the first epitaxial region includes:

growing a first portion of the first epitaxial region such that the first portion has a direct interface to a lateral sidewall of the offset liner layer, wherein the lateral sidewall of the offset liner layer is substantially parallel to the first sidewall of the recess and wherein an angle defined by an intersection between a top surface of the first epitaxial region and the lateral sidewall of the offset liner layer is less than 90 degrees;

removing the offset liner layer thereby removing the direct interface between the first portion of the first epitaxial region and the offset liner layer, and after removing the offset liner layer, growing a second portion of the first epitaxial region in the top portion of the recess filling the vacancy.

4. The method of claim 3, wherein the forming the offset liner layer includes forming a conformal layer on the substrate of the semiconductor material and etching the conformal layer to provide the offset liner layer on the first and second sidewalls of the recess.

5. The method of claim 3, wherein the forming the offset liner layer includes growing the offset liner layer on the first and second sidewalls of the recess.

6. The method of claim 3, wherein the first epitaxial region provides a source or drain region of the semiconductor device.

7. The method of claim 3, wherein the semiconductor device is a multi-gate fin-type device.

8. The method of claim 3, wherein the first epitaxial region is disposed in a fin structure, and wherein the epitaxial region interposes a first gate structure and a second gate structure formed over the fin structure.

9. A method of fabricating a semiconductor device, comprising:

forming a fin structure extending from a semiconductor substrate;

forming a first gate structure on the fin structure;

forming a second gate structure on the fin structure adjacent the first gate structure; and forming a dielectric layer in a recess within the fin structure, wherein the dielectric layer has a first height, and wherein the recess interposes the first and second gate structures, and wherein the dielectric layer is disposed on at least two sidewalls of the recess;

growing an epitaxial region in the recess, including:

growing a first region of epitaxy in the recess; wherein the first region of epitaxy interfaces with a first surface of a first region of the dielectric layer;

stopping the growing the first region of epitaxy providing the first region of epitaxy at a second height, the second height less than the first height, and wherein an angle defined by an intersection between a top surface of the first region of epitaxy and the first surface of the first region of the dielectric layer is less than approximately 90 degrees;

removing the dielectric layer after the growing of the first region of epitaxy, wherein the removing includes removing the first region of the dielectric layer to provide a first space between each of the at least two sidewalls of the recess and the first region of epitaxy;

after removing the dielectric layer from the recess, growing a second region of epitaxy on top of the first region of epitaxy and in the first space;

and wherein the epitaxial region includes a source/drain region associated with the first gate structure and another source/drain region associated with the second gate structure.

10. The method of claim 9, wherein the first and second regions of epitaxy have different compositions.

11. The method of claim 9, wherein the second region of epitaxy has a bottom surface disposed on the first region of epitaxy and wherein the bottom surface is concave in shape.

12. The method of claim 1, wherein the growing the first epitaxial region in the recess includes using a solid-phase epitaxy (SPE) process.

13. The method of claim 1, the forming the dielectric offset liner layer includes depositing one of a silicon oxide, a silicon nitride, and a silicon oxynitrides.

14. The method of claim 1, wherein the growing the second epitaxial region is performed by a solid-phase epitaxy (SPE) process.

15. The method of claim 1, further comprising during the growing the second epitaxial region performing an in-situ doping.

16. The method of claim 1, wherein the first and second epitaxial regions have a different composition.

* * * * *